(12) United States Patent
Tamaki

(10) Patent No.: US 6,205,050 B1
(45) Date of Patent: Mar. 20, 2001

(54) PROGRAMMED CIRCUIT IN A SEMICONDUCTOR DEVICE

(75) Inventor: Satoshi Tamaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/457,697

(22) Filed: Dec. 9, 1999

(30) Foreign Application Priority Data

Dec. 15, 1998 (JP) .................................................. 10-355899

(51) Int. Cl.[7] .................................................. G11C 11/00
(52) U.S. Cl. .................................................. 365/154; 365/96
(58) Field of Search .................................. 365/154, 225.7, 365/96, 156, 200, 222

(56) References Cited

U.S. PATENT DOCUMENTS 5,245,576  *  9/1993  Foss ........................................ 365/200
5,732,015  *  3/1998  Kazerounian ........................... 365/154
5,973,969  * 10/1999  Matsuki ................................... 365/154

FOREIGN PATENT DOCUMENTS 64-67798    3/1989  (JP) .

* cited by examiner

*Primary Examiner*—A. Zarabian
(74) *Attorney, Agent, or Firm*—Sughrue, Mion, Zinn, Macpeak & Seas, PLLC

(57) ABSTRACT

A semiconductor memory device has a redundancy decoder for replacing a defective memory cell by a redundancy memory cell. The redundancy decoder includes a programmed flip-flop having first and second transistors. The load of the first transistor is implemented by a fuse which is subjected selectively to cut-out or non-cut for programming by a laser beam, whereas the load of the second transistor is implemented by a resistor including a plurality of serial fuses subjected to non-cut. The redundancy decoder operates in a higher speed and has a lower power consumption.

15 Claims, 12 Drawing Sheets

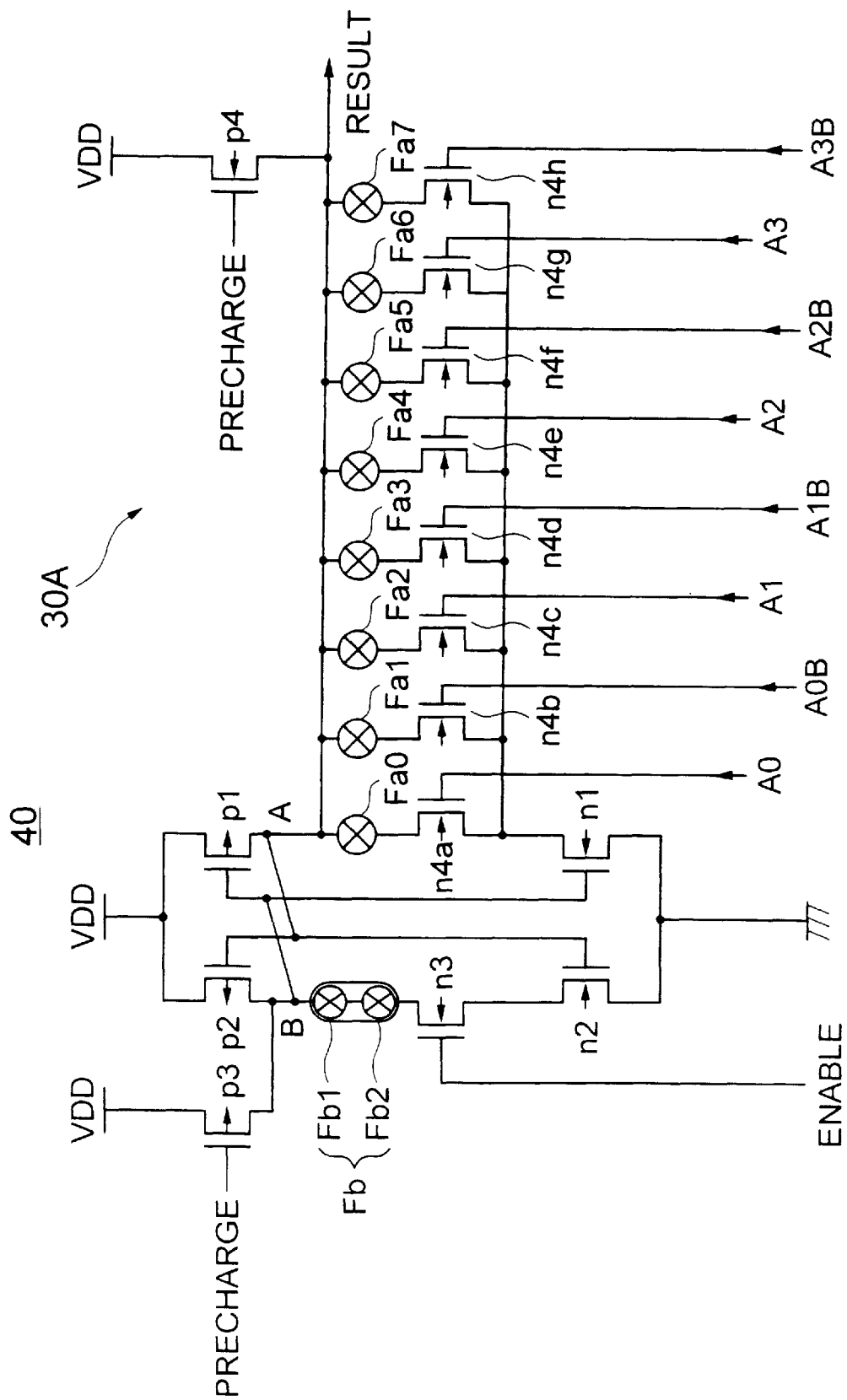

PROGRAMMED CIRCUIT IN A SEMICONDUCTOR DEVICE

BACKGROUND OF THE INVENTION (a) Field of the Invention

The present invention relates to a programmed circuit in a semiconductor device and, more particularly, to a programmed circuit suitably used in a redundancy circuit or switching circuit in a semiconductor memory device.

(b) Description of a Related Art

A highly integrated semiconductor memory device having a large storage capacity generally includes a redundancy circuit. The redundancy circuit is used for replacing a defective memory cell by a redundancy memory cell provided for this purpose, when the defective memory cell is detected in a product test after fabrication thereof.

The detection and replacement for the defective memory cell includes a cut-out procedure for redundancy fuses disposed in the redundancy circuit before the chip of the memory device is separated from a wafer. The cut-out of fuses is performed in a programming procedure for detecting the address of the defective memory cell replaced by the redundancy memory cell. It is necessary to secure the complete cut-out of the redundancy fuses for assuring the normal operation of the memory device.

FIG. 1 shows a conventional redundancy circuit in a DRAM 15. The redundancy circuit includes a one-shot pulse generator 19, a plurality of programmed circuits 17a to 17n each for detecting whether or not an input address signal specifies the address of a defective memory cell in a regular memory cell array 16a, a redundancy memory driver 18, an AND gate AND1 for receiving an input from each of the programmed circuits 17a to 17n and the redundancy memory driver 18. The DRAM 15 further includes an X-decoder 16c, Y-decoder 16d, a regular memory cell array 16a and a redundancy memory cell array 16b.

FIG. 2A shows an example of the programmed circuit shown in FIG. 1, and FIG. 2B shows one of the programmed branches shown in FIG. 2A. The programmed circuit 12 of FIG. 2A includes a number of programmed branches 11 shown in FIG. 2B corresponding to the number of bits of the address signal used in the memory device. In FIG. 2B, a p-ch precharge transistor p11 is turned on during a precharge period by a precharge signal supplied as a one-shot pulse to charge a node "C". Node "C" is discharged or not discharged in a subsequent detection period, through an n-ch transistor "n11" receiving an enable signal, depending on the on-state (non-cut) or off-state (cut-out) of the fuse F11. The potential of node "C" is detected as a result signal, which represents the cut-out or non-cut of the fuse F11.

The programmed circuit 12 shown in FIG. 2A is supplied with an input address signal including bits A0 to A3 as well as A0B to A3B, wherein "B" in A0B to A3B means "NOT" of the bits A0 to A3. If the programmed circuit 12 detects a defective address from the input address signal, the programmed circuit 12 replaces the input address by a redundancy address, thereby replacing the defective memory cell by the redundancy memory cell.

In the programmed circuit 12 of FIG. 2A, if the corresponding bit of A0 to A3 and A0B to A3B assumes a high level, the corresponding node "C" assumes a low level or a high level depending on the cut-out or non-cut of the fuses. On the other hand, if the fuse is incompletely cut to have an intermediate resistance between the off-sate and the on-state of the fuse, it takes a long time for the potential of node "C" to fall from the high level to a low level in the detection period. This causes a larger time length consumed for the detection and thus involves a lower operational speed of the memory device, or causes a failure in the detection period.

Such an incomplete cut-out in the redundancy circuit is increasing along with the increase of the number of redundancy fuses in the recent memory device. Especially in the DRAMs having a large storage capacity and having a multi-level interconnection structure, since the redundancy fuses are generally implemented by a silicide layer disposed as an underlying interconnect layer, the complete cut-out is difficult to achieve. So is the case of the redundancy fuses implemented by a metallic layer such as an aluminum layer.

FIGS. 3A and 3B are a top plan view and a sectional view, respectively, of a redundancy fuse before cut-out of the redundancy fuse, whereas FIGS. 3C and 3D are top plan view and a sectional view corresponding to FIGS. 2A and 2B, respectively, after the cut-out of the redundancy fuse for showing the problem of the incomplete cut-out.

As shown in FIG. 3B, the redundancy fuse 13b is irradiated by a laser beam through a window 14 formed in a cover film 13c covering a wafer 13. If the irradiated and evaporated portion of the redundancy fuse 13b is re-coagulated at the bottom of the etched portion of the window 14, or if the bottom portion of a thick redundancy fuse 13b is not completely evaporated, as shown in FIGS. 3C and 3D, the re-coagulated portion or remaining portion (referred to simply as a remaining portion) 13g may bridge the cut-out part of the fuse 13b. The remaining portion 13g generally has a resistance higher than the original resistance of the fuse 13b by several tens or a hundred times.

In another case, if the redundancy fuse is implemented by a metallic film generally having a higher reflective index, the metallic film reflects most part of the irradiated laser beam and may leave a remaining portion, and thus is difficult to achieve a complete cut-out. This is especially true in the case of a redundancy fuse implemented by a contact plug 13f made of tungsten and connecting interconnect layers 13e and 13d, such as shown in FIGS. 3E and 3F showing sectional views before and after, respectively, the cut-out of the redundancy fuse 13f. This is because the tungsten has a different heat absorption rate from that of aluminum etc.

A technique for solving the problem incomplete cut-out is described in Patent Publication JP-A-64-67798. FIG. 4 shows the improved programmed circuit in the redundancy circuit described therein. In the redundancy circuit shown in FIG. 4, the programmed circuit 17 for a single bit of the address signal has a fuse F12 which is programmed depending on the data stored, a flip-flop circuit FF12 outputting a data depending on the programming of the fuse F12 when an enable signal is input, and an output section 17a implemented by a pair of transfer gates G1 and G2 for receiving corresponding bit signals A0 and A0B, for example, of an input address for delivering a detection signal of the bit.

In this configuration, the flip-flop circuit FF12 delivers a stable output corresponding to the cut-out or non-cut of the fuse F12 irrespective of the incomplete cut-out of the fuse F12, although the flip-flop FF12 has a some delay in delivering a correct output in the case of incomplete cut-out.

In a conventional memory device, it is generally desired that the circuit area for the redundancy circuit be reduced. In this respect, it is desirable that the one-shot pulse generator provided for each decoder circuit in the conventional memory device be deleted. In addition, in the proposed programmed circuit, the delay which may appear in the flip-flop circuit FF12 in the case of the incomplete cut-out involves a difficult setting for the delay time in the redundancy circuit.

SUMMARY OF THE INVENTION

It is therefore an object of the present invention to provide an improved programmed flip-flop which is capable of reducing the circuit scale of a conventional memory device having a redundancy circuit by deleting the one-shot pulse generator and capable of obviating the difficult timing setting of the delay as encountered in the conventional memory device by reducing the delay in the programmed circuit.

The present invention provides a programmed flip-flop comprising first and second transistor, and first and second loads connected in series with the first and second transistors, respectively, between a first source line and a second source line, each of the first and second transistors having a control electrode connected to a node connecting the other of the first and second transistors and a corresponding one of the first and second loads, the first load being subjected to programming for changing resistance of the first load.

In a redundancy circuit in a semiconductor memory device having the programmed flip-flop of the present invention, the redundancy circuit operates in a higher speed even in the case of incomplete cut-out of the fuses in the redundancy circuit. In addition, a one-shot pulse generator is not necessary in the redundancy circuit, whereby the circuit scale for the redundancy circuit can be reduced.

The above and other objects, features and advantages of the present invention will be more apparent from the following description, referring to the accompanying drawings.

BRIEF DESCRIPTION OF THE DRAWINGS

FIG. 9A is a schematic diagram of a redundancy circuit according to a third embodiment of the present invention.

PREFERRED EMBODIMENTS OF THE INVENTION

Figure 1:
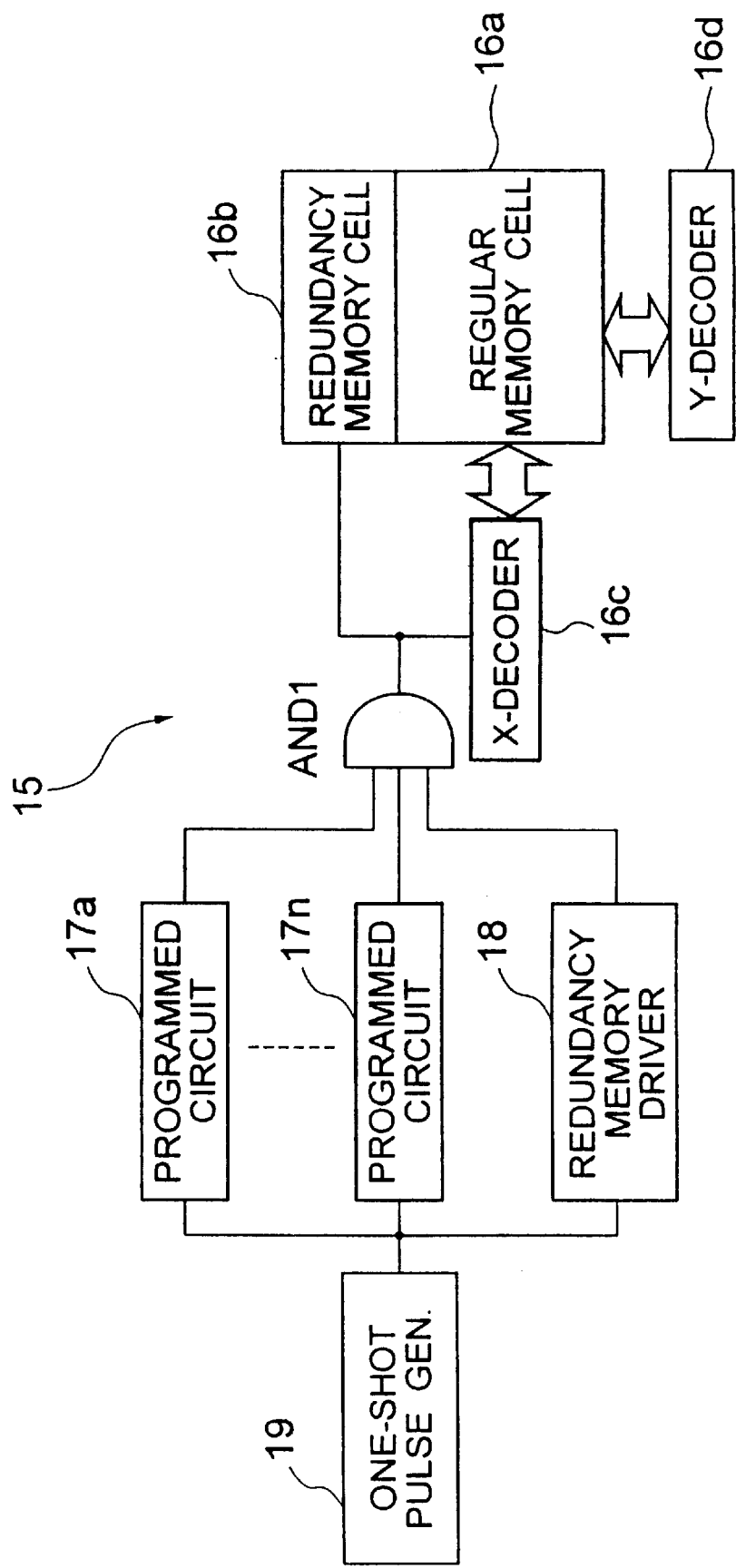
FIG. 1 is a block diagram of a memory device having a conventional redundancy circuit.
Figure 2A:
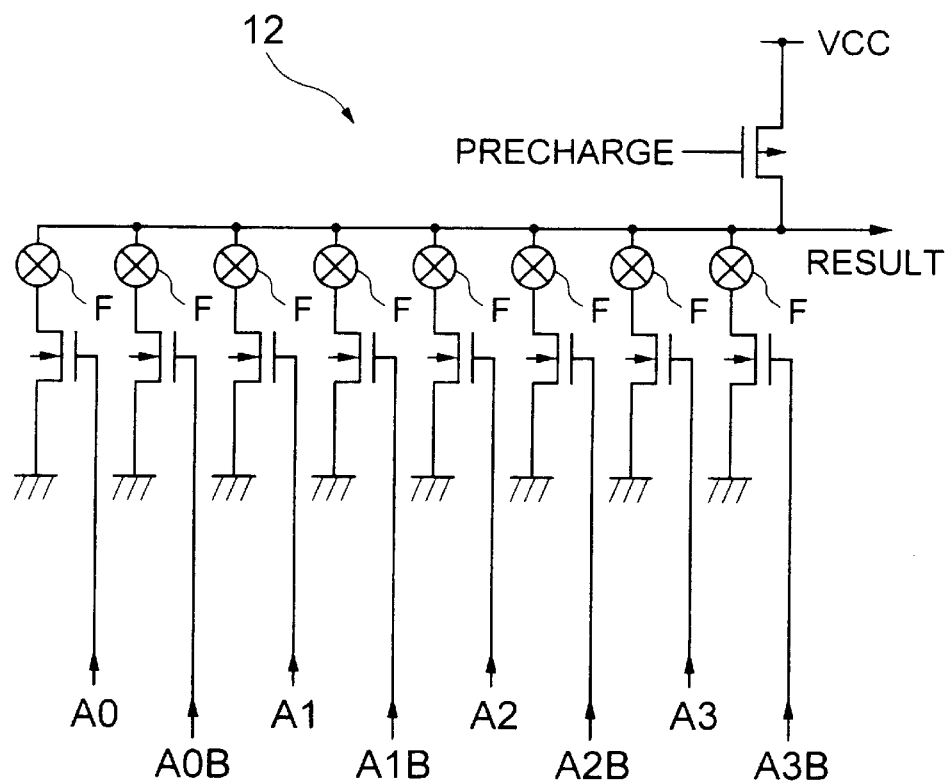
FIG. 2A is a circuit diagram of the programmed circuit shown in the redundancy circuit of FIG. 1.
Figure 2B:
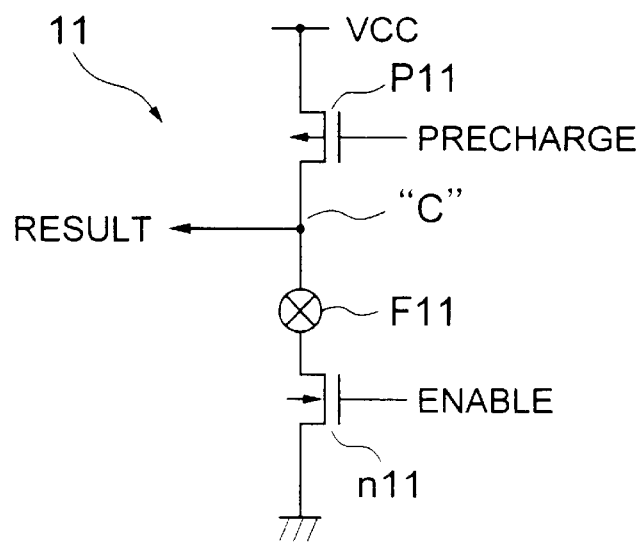
FIG. 2B is a circuit diagram of a principle of the programming branch of the redundancy circuit.
Figure 3A:
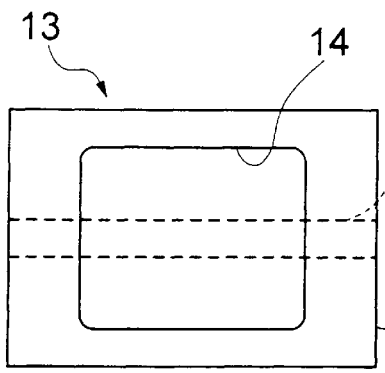
FIGS. 3A to 3F are top plan views and sectional views for showing the structure and defects caused by an incomplete cut-out of the redundancy fuse.
Figure 3B:
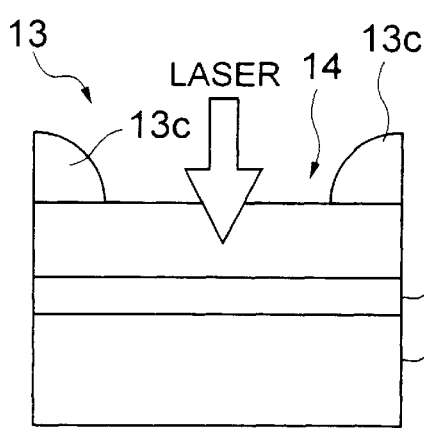
Figure 3C:
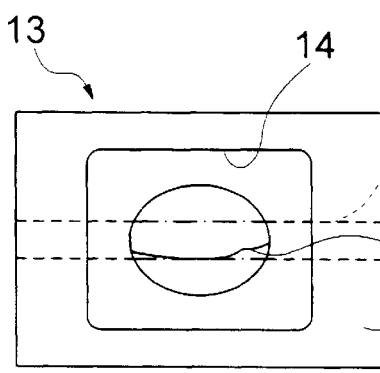
Figure 3D:
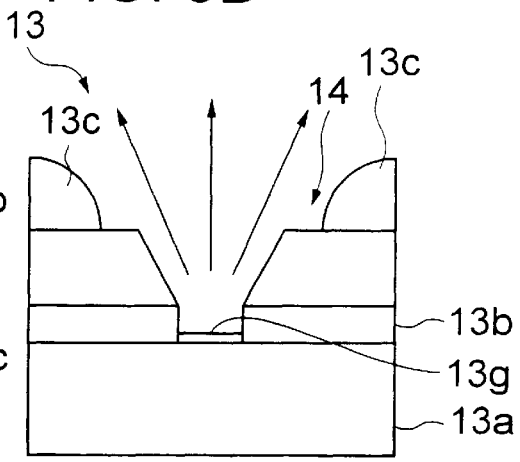
Figure 3E:
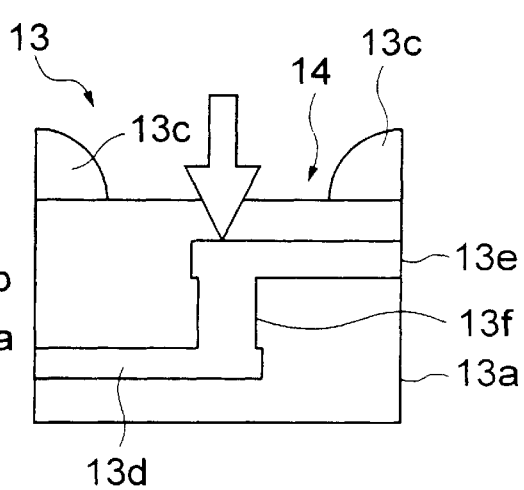
Figure 3F:
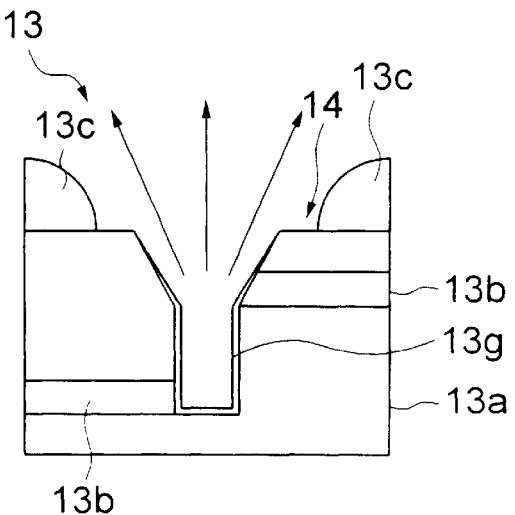
Figure 4:
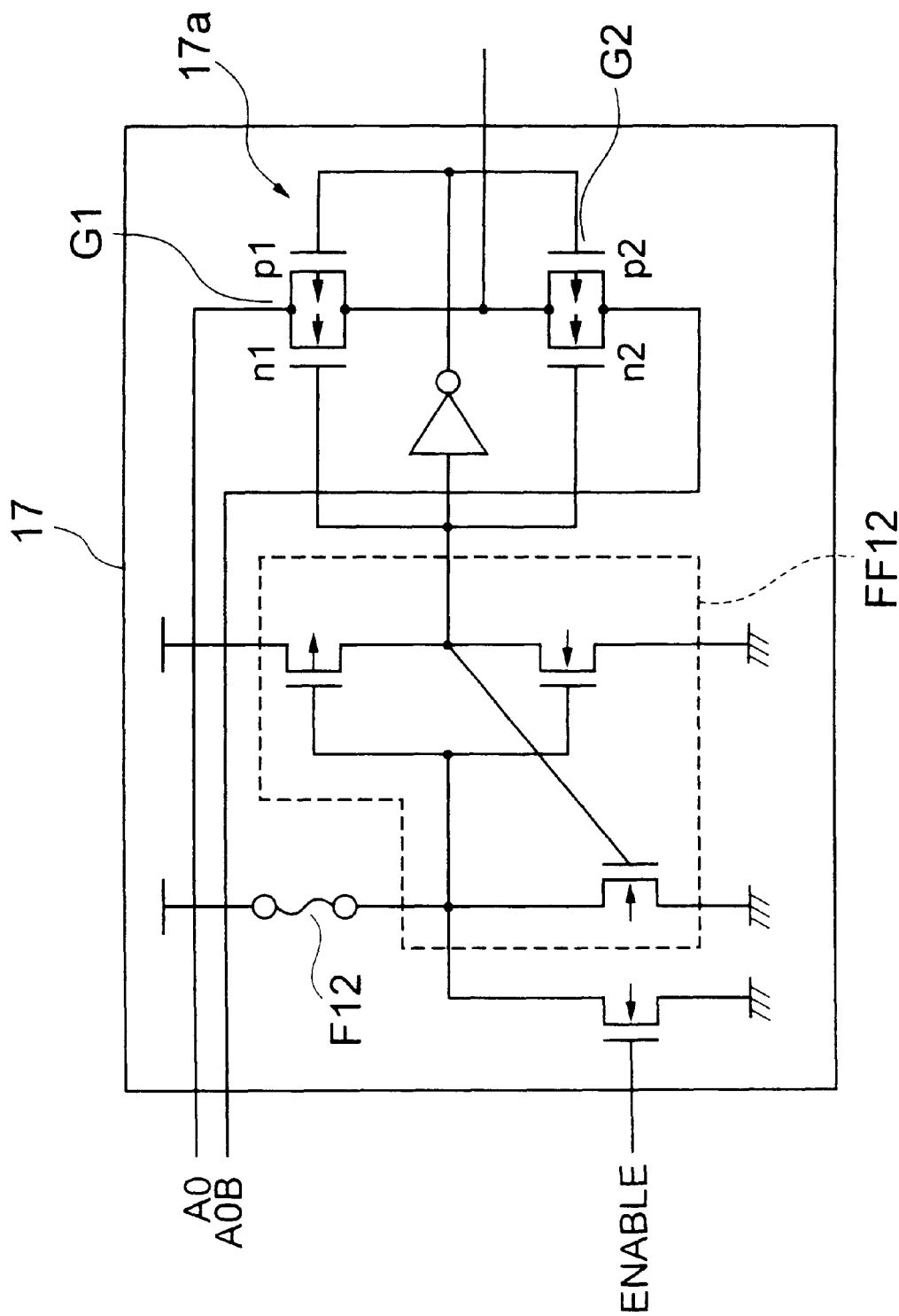
FIG. 4 is a schematic diagram of a programmed circuit proposed in a publication.

Now, the present invention is more specifically described with reference to accompanying drawings, wherein similar constituent elements are designated by similar reference numerals.

Figure 5:
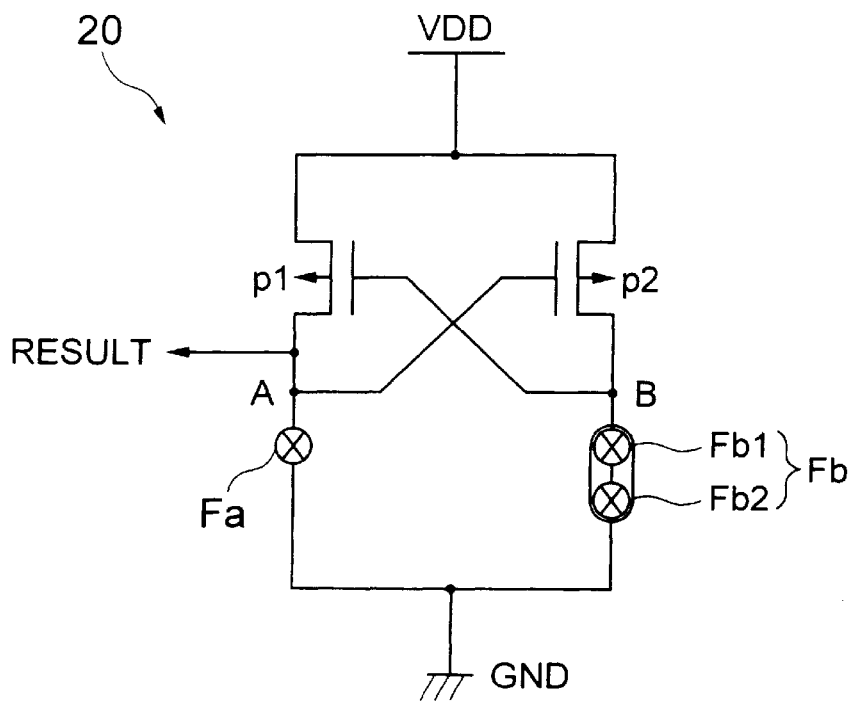
FIG. 5 is a schematic diagram of a programmed flip-flop according to a first embodiment of the present invention.

Referring to FIG. 5, a programmed circuit (or programmed flip-flop) 20 according to a first embodiment of the present invention includes a pair is of p-ch MOS transistors p1 and p2 each having a source connected to a VDD line, a gate connected to the drain of the other of the p-ch transistors p1 and p2, and a drain connected to the ground line GND through a corresponding fuse Fb or load resistor Fb. In other word, the flip-flop 20 has a first branch including p-ch transistor p1 and the fuse Fa serially connected between VDD line and the ground line GND, and a second branch including p-ch transistor p2 and the load resistor Fb serially connected between VDD line and the ground line GND.

The load of P-channel transistor p1 is implemented by the fuse Fa programmed to a cut-out or non-cut state, whereas the load of p-ch transistor p2 is implemented by the load resistor Fb including a plurality (pair in this case) of serial fuses Fb1 and Fb2 not programmed.

The load resistor Fb has a resistance which is higher than the resistance of the fuse Fa in the case where the fuse Fa is not cut and lower than the resistance of the fuse Fa in the case where the fuse Fa is cut out either completely or incompletely. Each of the fuses Fb1 and Fb2 implementing the load resistor Fb may have a configuration and thus a resistance similar to those of the fuse Fa. Alternatively the load resistor Fb may be implemented as an ordinary fixed resistor.

If the fuse Fa is implemented by a metallic film, for example, the fuse Fa which is completely cut out has a resistance of several kilo-ohms to several mega-ohms which is higher than the original resistance of the fuse by a thousand times or more, whereas the fuse Fa wich is incompletely cut out has a resistance around several hundreds of kilo-ohms.

In the configuration of FIG. 5, the programmed state of the fuse Fa is detected by detecting the level of a result signal which is supplied as the potential of the drain node (node "A") of p-ch transistor p1.

More specifically, if the fuse Fa is cut either completely or incompletely, the resistance of the fuse Fa is higher than the resistance of the load resistor Fb, whereby p-ch transistor p1 is turned on due to a lower gate potential. This raises the potential of node "A" up to a high level to tun off p-ch transistor p2, whereby node "B" connecting the drain of p-ch transistor p2 and the gate of p-ch transistor p1 is coupled to the ground line and thus assumes a low level. The low level of node "B" maintains p-ch transistor p1 on, which is consistent with the original state, and thus the programmed flip-flop finally delivers a high level through node "A" as a result signal.

On the other hand, if the fuse Fa is not cut, the resistance of the fuse Fa is lower than the resistance of the load resistor Fb, whereby p-ch transistor p2 is turned on. Thus, p-ch transistor p1 is turned off to finally lower the potential of node "A" to the ground level, whereby the programmed flip-flop delivers a low level for the result signal through node "A". In either case of cut-out or non-cut of the fuse in the present embodiment, the programmed flip-flop determines the finally state thereof in a higher speed compared to the conventional programmed circuit. The level of node "A"

can be detected by a level detection circuit such as the AND gate shown in FIG. 1 to activate the redundancy memory cell in the redundancy cell array.

Figure 6:
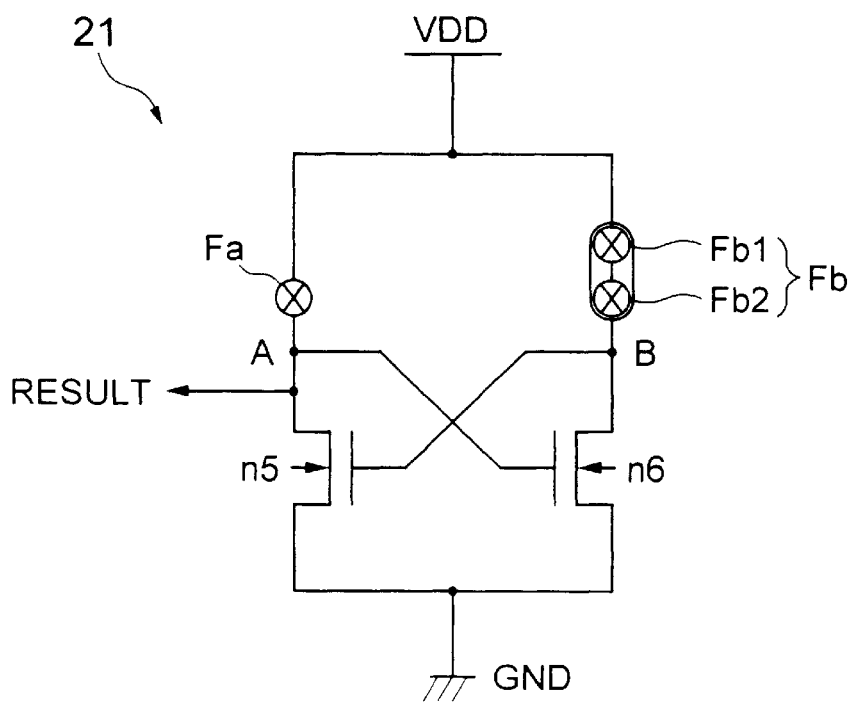
FIG. 6 is a schematic diagram of a modification of the programmed circuit of FIG. 5.

Referring to FIG. 6 showing a modification of the programmed flip-flop 20 of FIG. 5, the flip-flop 21 according to the modification is implemented by a pair of n-ch transistors n5 and n6 instead of p-ch transistors p1 and p2 in FIG. 5, with the other configuration being similar to that in FIG. 5. In this configuration, a high level and a low level of the result signal corresponds to non-cut and cut-out states, respectively, of the fuse. A redundancy circuit having the programmed flip-flop 20 or 21 does not require a one-shot pulse generator, which reduces the circuit scale for the redundancy circuit having the programmed flip-flop 20 or 21 of the present embodiment.

Figure 7:
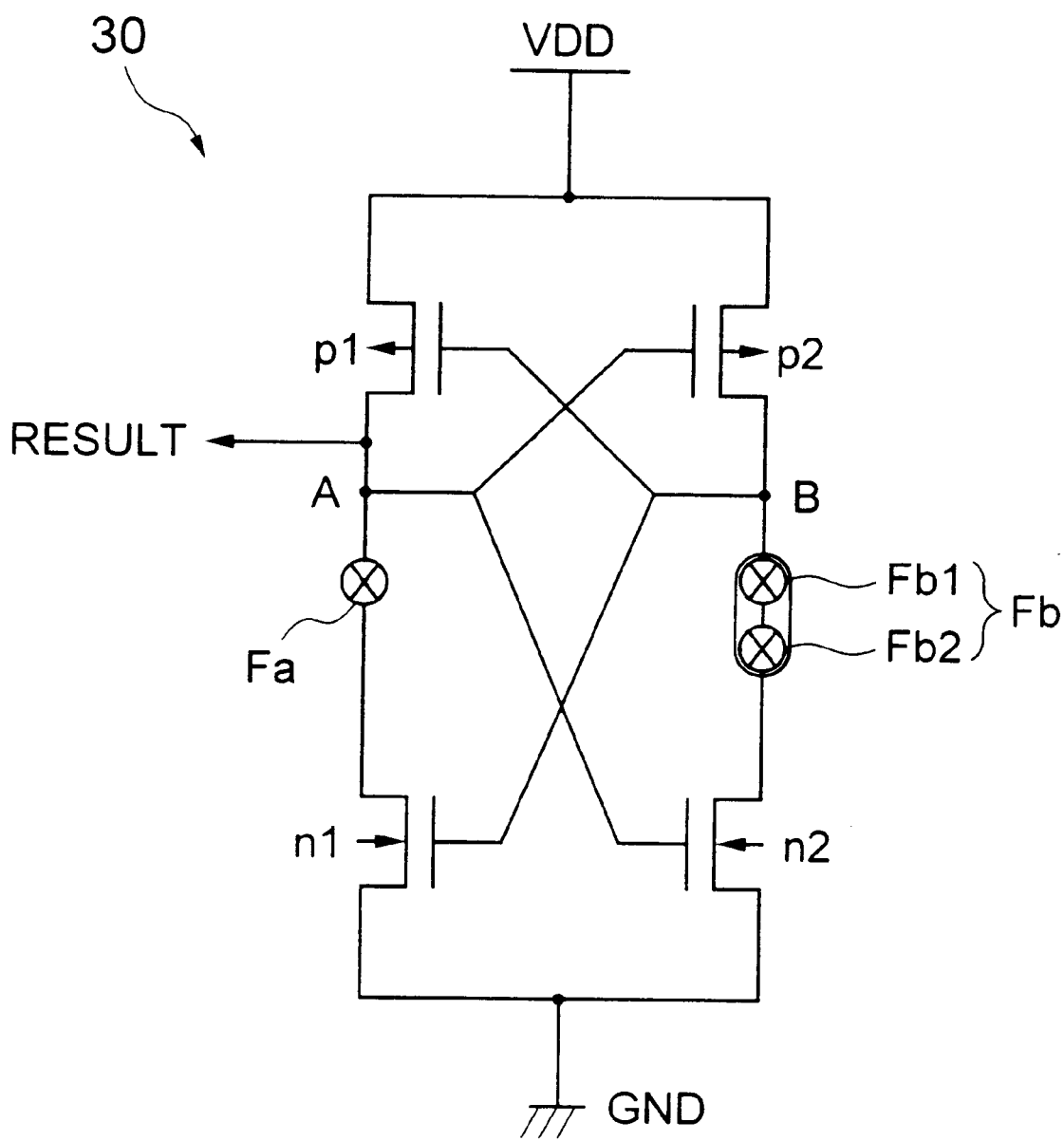
FIG. 7 is a schematic diagram of a programmed flip-flop according to a second embodiment of the present invention.

Referring to Fig. FIG. 7, a programmed flip-flop according to a second embodiment of the present invention is similar to the first embodiment except that the programmed flip-flop 30 in the present embodiment additionally includes a pair of current cut-off n-ch transistors n1 and n2 connected in the first and the second branches, respectively, i.e., connected in series with p-ch transistors p1 and p2, respectively.

More specifically, the programmed flip-flop 30 of the present embodiment includes, in addition to the configuration of the first embodiment, an n-ch transistor n1 connected between the fuse Fa and the ground line GND, and an n-ch transistor n2 connected between the load resistor Fb and the ground line GND. Node "A" connecting the fuse Fa and the drain of p-ch transistor p1 delivers a result signal used for detecting the programmed state of the fuse Fa.

Figure 8A:
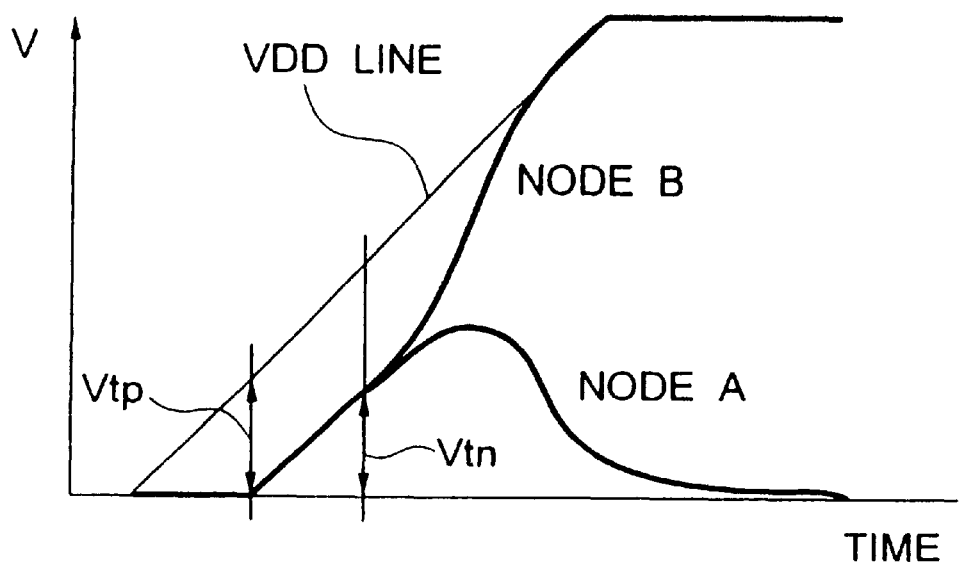
FIG. 8 is a timing chart of the operation of the programmed flip-flop of FIG. 7.
Figure 8B:
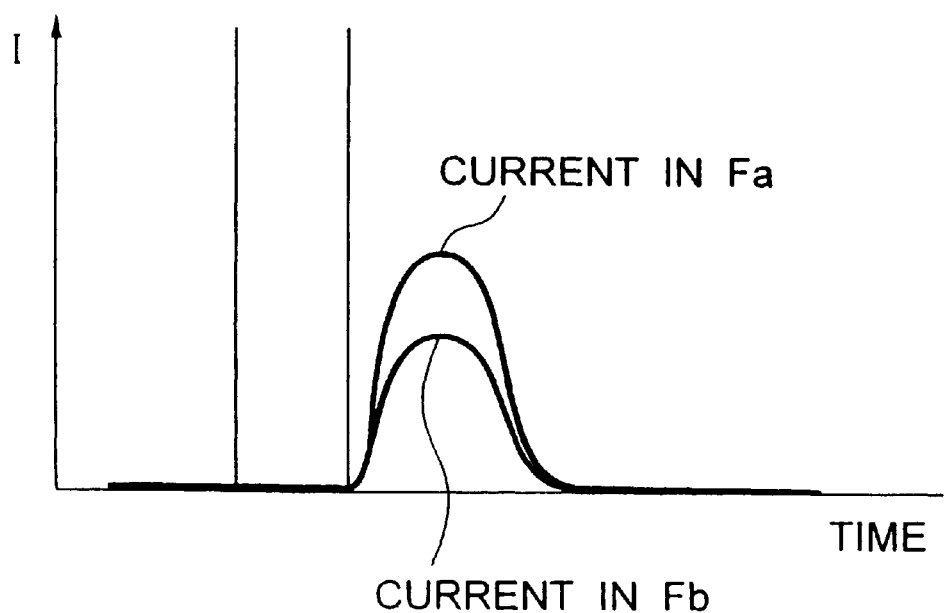

Referring to the timing chart of FIG. 8, in the case of non-cut of the fuse Fa, the programmed flip-flop responds to the transitional state of the potential of the VDD line. In FIG. 8, after the potential of VDD line rises during the transitional state thereof from the ground level to exceed the threshold voltage Vtp of p-ch transistor p1, p-ch transistor p1 is turned on, whereby both nodes "A" and "B" rise from the ground level while maintaining a potential difference Vtp with respect to the potential of VDD line.

At this stage, the gate potentials of n-ch transistors n1 and n2 which are equal to the potentials of nodes "B" and "A", respectively, do not exceed the threshold voltage Vtn of n-ch transistors. Thus, n-ch transistors n1 and n2 are OFF, whereby both the branches passing the fuses Fa and the load resistor Fb do not pass current therethrough.

After the potential of nodes "A" and "B" exceed the threshold voltage Vtn of n-channel transistors n1 and n2 with the potential rise of the VDD line, n-ch transistors n1 and n2 are turned on. Thus, current flows from the VDD line to the ground line passing through nodes "A" and "B", which generates a potential difference between nodes "A" and "B" due to the difference in the current passing therethrough.

Assuming that the resistance of the fuse Fa, the on-resistances of p-ch transistors p1 and p2, the on-resistances of n-ch transistors n1 and n2, and a constant determined based on the number of fuses constituting the load Fb are r, Rp, Rn and k (k>1), respectively, currents IA and IB passing through nodes "A" and "B", respectively, and potentials VA and VB of nodes "A" and "B", respectively, are represented by the following relationships:

$IA=VDD/(r+Rn+Rp);$ $VA=VDD\times(r+Rn)/(r+Rp+Rn);$ $=VDD\times\{1-Rp/(r+Rp+Rn)\};$ $IB=VDD/(k\times r+Rn+Rp);$ and $VB=VDD\times\{1-Rp/(k\times r+Rp+Rn)\}.$ From the above relationships, VA<VB holds, and these transistors eventually settles the potentials of nodes "A" and "B" while receiving respective potentials VA and VB at the gates thereof. The settlement in the programmed flip-flop 30 is such that the potential of node "A" falls to the ground potential and the potential of node "B" rises to the VDD potential. The result of the settlement is detected by judging the potential of node "A". In the present embodiment, after the settlement, currents do not flow through nodes "A" and "B", which fact reduces the power dissipation of the redundancy circuit having the programmed circuit in the present embodiment compared to the first embodiment.

On the other hand, if the fuse Fa is cut in the programming, and assuming that the resistance of the cut-out fuse is Rn, the relationships are as follows:

$IA=VDD/(Rf+Rn+Rp);$ and $VA=VDD\times\{1-Rp/(Rf+Rp+Rn)\}.$

Here, if the fuse Fa is completely cut, VA and VB assume the VDD potential and the ground potential, respectively, whereby the programmed state of the fuse can be detected by the potential VA. On the other hand, if the fuse is incompletely cut, it is expected that at least the following condition holds:

$(50 \text{ to } 100)\times r < Rf.$

Assuming that the value for "k" satisfies 1<k<50, the above relationships lead to VA>VB, and the programmed state of the fuse can be judged accordingly. In this state, n-ch transistor n1 is OFF to thereby stop the current flowing therethrough between the VDD line and the ground line GND irrespective of ON or OFF of p-ch transistor p2.

As described above, in the present embodiment, if the fuse Fa is cut either completely or incompletely in the programming to have a higher resistivity than the original resistivity, a high level of the result signal can be obtained. On the other hand, if the fuse is not cut in the programming thereof, a low level of the result signal can be obtained. In either case, n-ch transistors n1 and n2 constituting another flip-flop section in the programmed flip-flop 30 do not allow current flowing in the programmed flip-flop 30 after the settlement thereof, thereby reducing power dissipation of the programmed flip-flop.

In addition, since the potentials of both nodes "A" and "B" are settled in the programmed flip-flop 30 in a short time length, the incomplete cut-out of the fuse does not cause a substantial delay for judgment of the potential of node "A" in the programmed flip-flop.

Referring to FIG. 9A, there is shown a redundancy address decoder 40 including a programmed flip-flop 30A according to a third embodiment of the present invention. In the present embodiment, the second branch of the flip-flop 30A including the load resistor Fb is common to a plurality of the parallel first branches including respective programmed fuses Fa0, Fa1, . . . , Fa7.

The address decoder 40 includes the programmed flip-flop 30A as described above, a pair of precharge p-ch transistors p3 and p4 for precharging respective branches of the flip-flop 30A, an n-ch transistor n3 connected between the load resistor Fb and n-ch transistor n2. The parallel first branches each including a programmed fuse Fa0, Fa1, . . . or Fa7 are provided in number which is double the number of bits of the input address signal. In this example, the number of the first branches is eight corresponding to the four bits of the address signal. The load resistor Fb in the second branch is implemented by a plurality (two in this case) of serial fuses Fb1 and Fb2 each having a resistance equal to the resistance of the fuse Fa.

The precharge transistor p3 or p4 has a source connected to the VDD line, a gate for receiving a precharge signal, and a drain connected to node "B" or "A" of the corresponding branch of the programmed flip-flop 30A. N-ch transistor n3 receives an enable signal for activating the flip-flop 30A.

In operation, if none of the fuses Fa0 to Fa7 is cut, each of the programmed fuses has a resistance of "r". Accordingly, if "m" out of the eight signals of the address signal assume a high level, the overall resistance of the fuse array is equal to r/m. In the case of eight first branches, as in the present embodiment, "m" is equal to four.

Figure 9B:
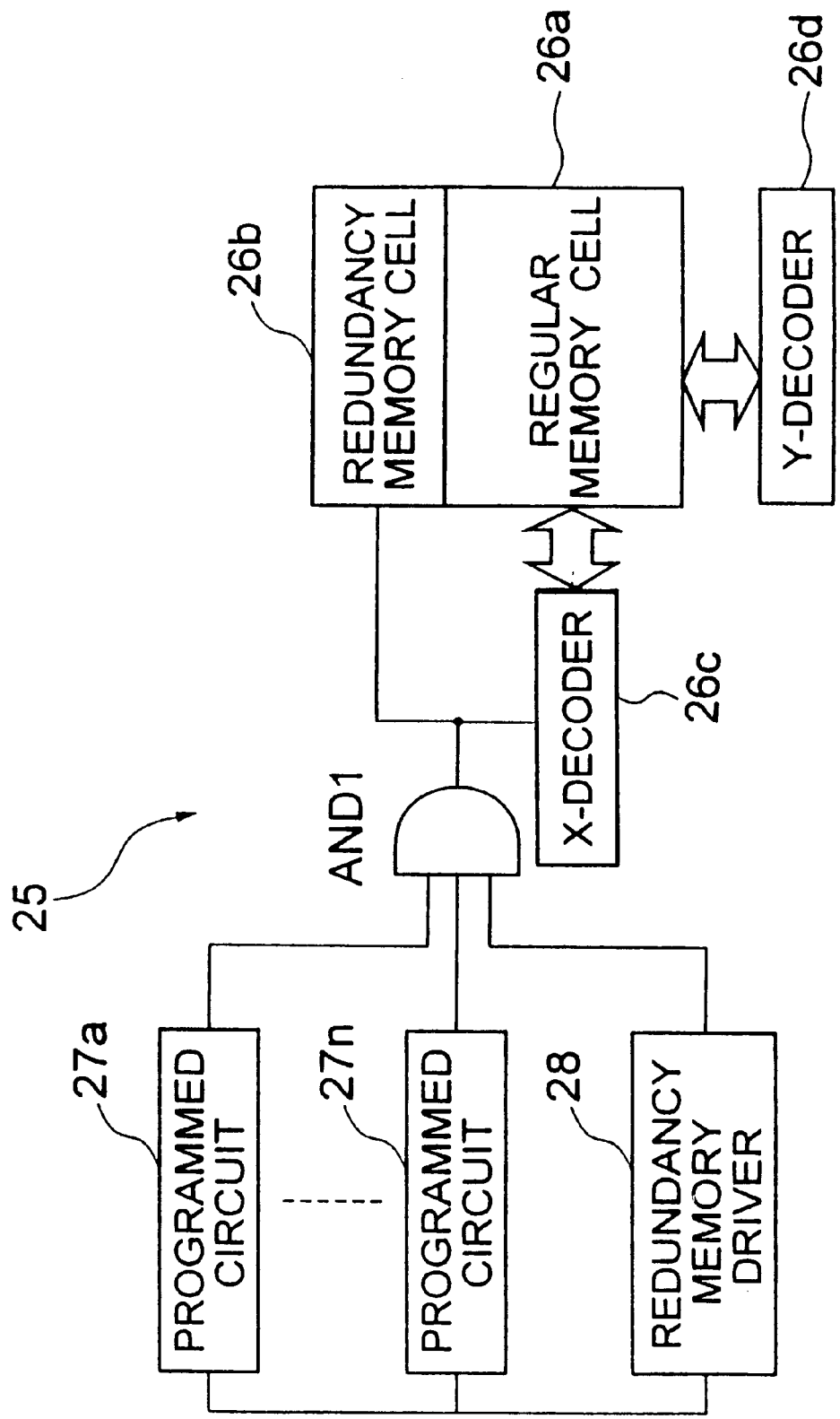
FIG. 9B is a block diagram of a semiconductor memory device having the redundancy circuit of FIG. 9A.

Referring to FIG. 9B, there is shown a semiconductor memory device having the programmed circuit of FIG. 9A. The semiconductor memory device of the present embodiment has a configuration similar to the configuration of the conventional memory device shown in FIG. 1 except for the structure of the programmed circuit, which is implemented by the programmed circuit of FIG. 9A and deletion of the one-shot pulse generator.

Figure 10A:
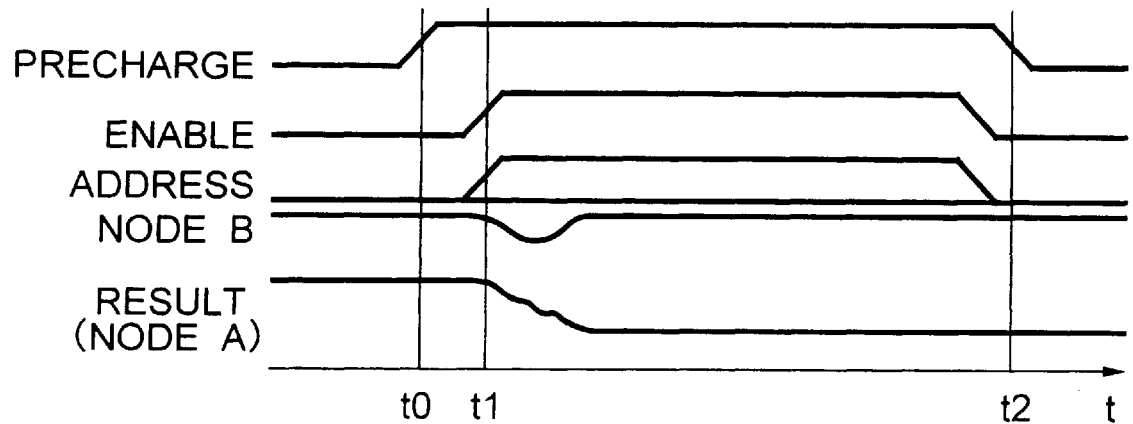
FIGS. 10A and 10B are timing charts of the operation of the redundancy circuit of FIG. 9A for the case of non-cut and cut-out, respectively, of the fuse.
Figure 10B:
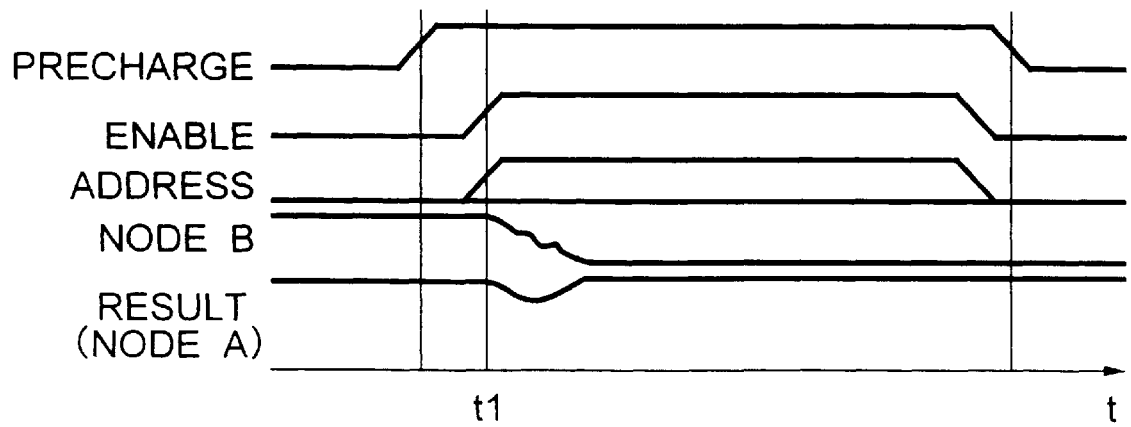

Referring to FIG. 10A showing a timing chart for the case of non-cut of the fuse in the present embodiment, both node "A" (result node) and node "B" are precharged by an active level of the precharge signal before time t0, followed by a rise of the precharge signal to an inactive level thereof at time to. Then, the address signal and the enable signal are activated substantially at the same time, i.e. at time t1. After the activation of the address signal and the enable signal, a potential difference is generated between node "B" and the ground line GND to cause a current flow.

Since p-ch transistors p1 and p2 are OFF due to the precharge of nodes "A" and "B", the potential difference between node "B" and the ground line GND determines the currents IB and IA flowing through nodes "B" and "A", respectively, as follows:

$$IB=VDD/(k{\times}r+Rn); \text{ and}$$

$$IA=VDD/\{(r/m)+Rn\},$$

wherein "k" is the number of serial fuses Fb1 and Fb2 constituting the load resistor Fb, "m" is the number of signals of the address signal assuming a high level, and Rn is the ON-resistance of n-ch transistors n1 and n2. Thus, IA>IB results, whereby the relationship between VA and VB is such that VA <VB.

After a significant potential difference is generated between node "A" and node "B", and the potential of node "A" exceeds the threshold voltage Vtp of p-ch transistors, p-ch transistor p2 having a drain connected to node "B" is turned on. The on-state of p-ch transistor p2 raises the potential of node "B" up to the VDD level in a short time to thereby settle the programmed flip-flop in a stable state thereof wherein the potentials of nodes "B" and "A" are VDD level and the ground level, respectively, as shown in FIG. 10A. The settlement of the flip-flop reveals that the input address is not equal to the programmed address in the redundancy address decoder.

There are two cases for the cut-out of the fuses Fa depending on the condition wherein the bit of the address signal corresponding to the cut-out fuse is high or low. The case for a high level of the corresponding signal is called herein a "hit case" and the case for a low level of the corresponding signal is called a "miss-hit case".

If "m" out of q signals for the address signal are hit and "n" out of the q signals are miss-hit, and assuming that each of the programmed fuses has a resistance of Rf after the cut-out, the overall resistance Ro is expressed as follows:

$$Ro = \{(Rf/m) \times (r/n)/\{(Rf/m) + (r/n)$$

$$= \{(Rf \times r)/(n \times Rf + m \times r)\}$$

Thus, the following relationships:

$$IB=VDD/(k{\times}r+Rn); \text{ and}$$

$$IA=VDD/\{(Rf/n{\times}Rf+m{\times}r){\times}r+Rn\}$$

can be obtained. In the equation, the following relationship:

$$(Rf/n{\times}Rf+m{\times}r){\times}r<k{\times}r$$

holds for the cases other than the case of n=0 wherein the redundancy circuit is hit by all the signals of the address signal. Thus, if n≠0, IB<IA holds. The result signal assumes a low level for the case of k≧2, whereby the programmed flip-flop is settled into the stable state.

If n=0 wherein the redundancy circuit is hit by all the signals of the address signal, the currents IB and IA flowing through the nodes "B" and "A", respectively, are settled such that:

$$IB=VDD/(k{\times}r+Rn); \text{ and}$$

$$IA=VDD/\{(Rf/m)+Rn\}.$$

If IB>IA, k×r<Rf/m holds. Thus, it can be judged that the fuse is cut in the programming. For satisfying the above condition k×r<Rf/m, k should be lower than (Rf/r)×(1/m). This can be satisfied by the condition 1<*k*<5 provided that the ratio of the resistance Rf of the incompletely cut-out fuse to the resistance "r" of the original fuse is 50 and the number "m" of the signals of the address signal for the hit case is 10.

In a conventional redundancy circuit using redundancy fuses in a DRAM, a pair of redundancy fuses are generally provided for a single bit of the address signal, and one of the pair of fuses is selectively cut for programming by a laser beam. In this case, windows are provided for both the pair of fuses for passing the laser beam. In the present invention, a single window is sufficient for a pair of fuses because one of the fuses is used for the load resistor, which is not subjected to the programming. Thus, the number of windows can be reduced in the present invention for achieving a reduced occupied area. In addition, the programmed flip-flop does not require a one-shot pulse signal for detecting cut-out or non-cut of the fuse, which further reduces the occupied area for the DRAM.

Figure 11:
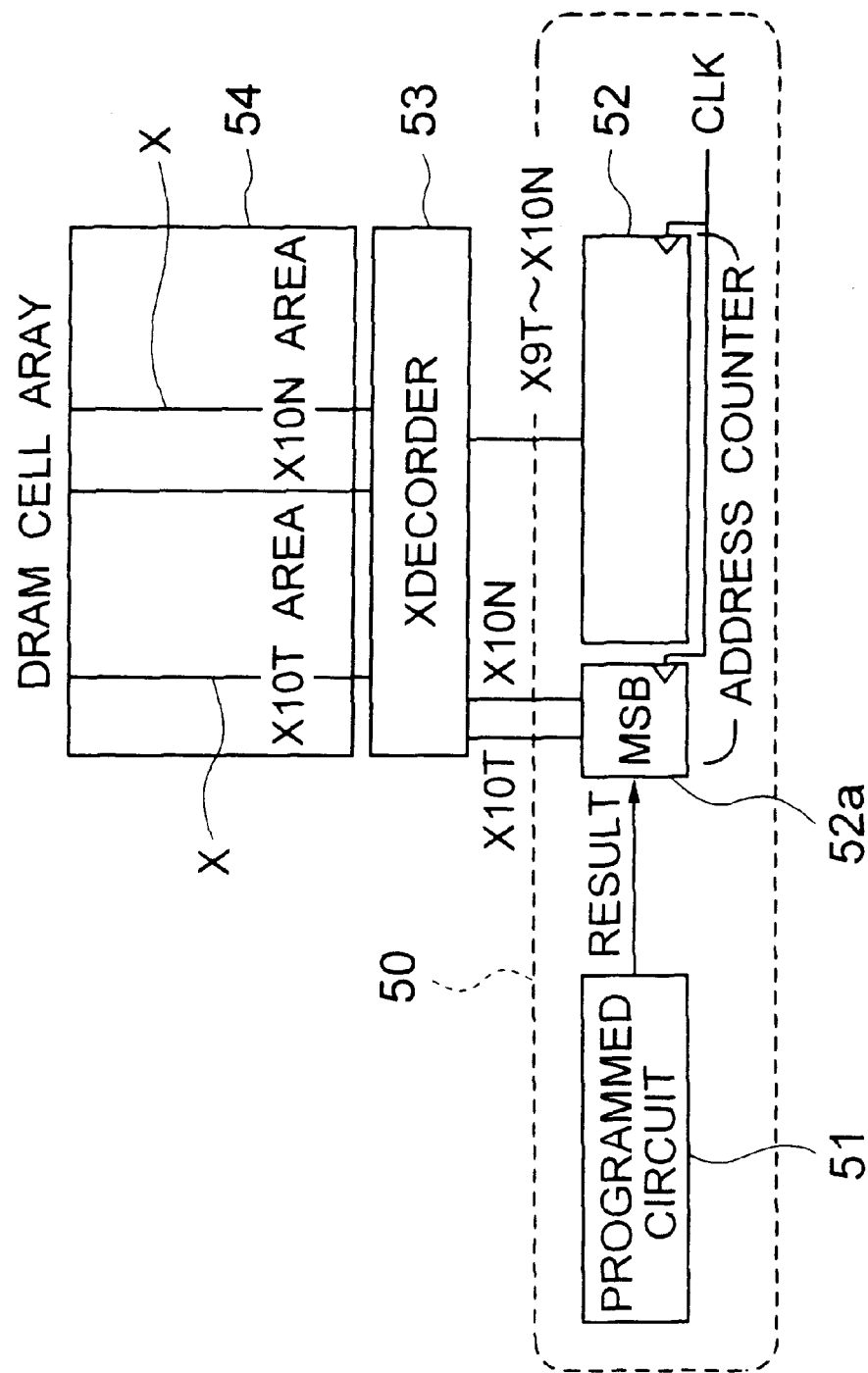
FIG. 11 is a schematic diagram of a DRAM having mode switching circuit according to a fourth embodiment of the present invention.

Referring to FIG. 11, there is shown a DRAM having the programmed circuit of FIG. 5 or 7 according to a fourth embodiment of the present invention. The DRAM is of a type having a built-in address counter 52 for generating a sequence of address signals instead of receiving input address signals from outside the memory device, wherein a variable refreshing period is implemented by a programmed flip-flop 51 for selecting the CBR (CAS before RAS) refreshing mode of the DRAM.

The DRAM has a memory cell array 54 including a first cell area X10T having word lines specified by X10T of a most significant bit (MSB) and a second cell area X10N having word lines specified by X10N of MSB. The DRAM has a mode switching circuit 50 including the programmed circuit 51, and the address counter 52 for generating a sequence of X-addresses to be supplied to the X-decoder 53. In this configuration, the mode switching circuit 50 switches the CBR refreshing mode of the DRAM between a 1 k-bit refreshing mode DRAM and a 2 k-bit refreshing mode DRAM, as detailed below, in the final fabrication process thereof to select the type of the product.

Figure 12A:
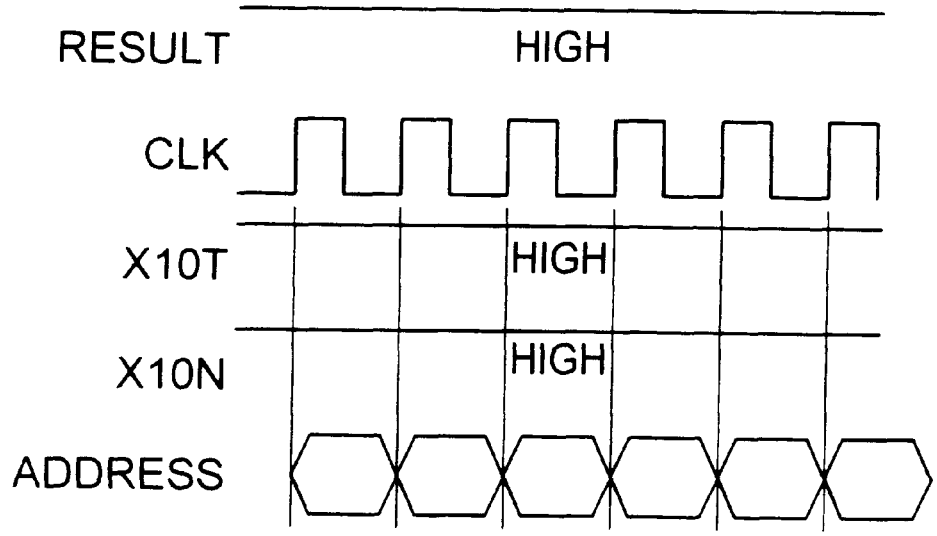
FIGS. 12 and 12B are timing charts of the mode switching circuits of FIG. 11 for the cases of a high level and a low level, respectively, of the result signal.
Figure 12B:
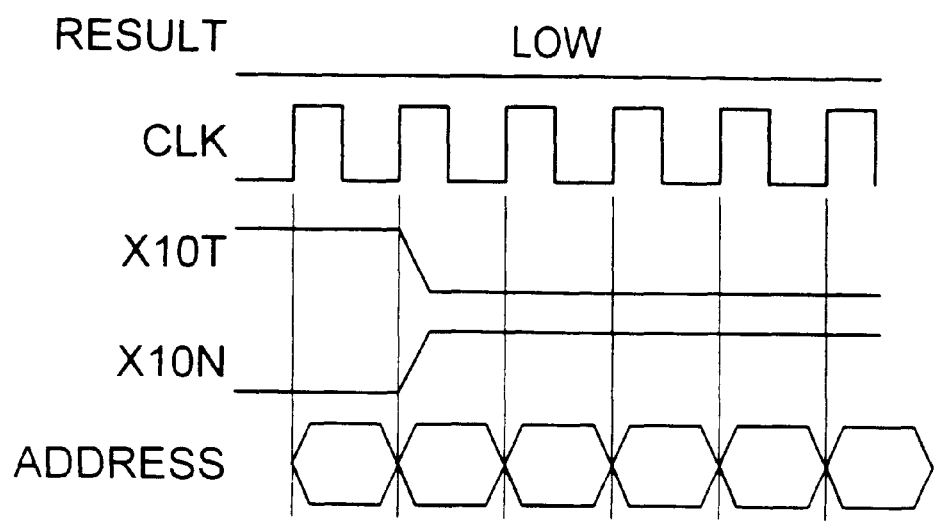

FIGS. 12A and 12B respectively show timing charts of the operation of the DRAM of FIG. 11, wherein FIG. 12A shows the case of a high level of the result signal output from the programmed flip-flop for achieving a 1 k-bit refreshing mode DRAM which is obtained by a cut-out fuse in the programmed flip-flop, and FIG. 12B shows the case of a low level of the result signal output from the programmed flip-flop for achieving a 2 k-bit refreshing mode DRAM which is obtained by a non-cut fuse.

In FIG. 12A, due to the cut-out fuse in the programmed circuit 51, the result signal assumes a high level, and thus, the MSB section 52a of the address counter 52 delivers a high level on both the MSB signal lines X10T and X10N. The X-decoder 53 decodes the address signal except for the MSB, whereby both the areas X10T and X10N are activated at any time for refreshing, to thereby achieve a 1 k-bit refreshing mode in the DRAM.

In FIG. 12B, due to the non-cut fuse in the programmed circuit 51, the result signal assumes a low level, and thus, the MSB section 52a of the address counter 52 delivers a high level alternatively on the signal lines X10T and X10N. The X-decoder 53 decodes the whole bits of the address signal, whereby both the areas X10T and X10N are alternatively activated for refreshing, to thereby achieve a 2 k-bit refreshing mode in the DRAM.

In the present invention, the programmed flip-flop correctly detects the cut-out of programmed fuse even for the case of incomplete cut-out, as described above, and the time length for detecting the cut-out or non-cut of the fuse is not substantially affected by the incomplete cut-out. This provides a higher-speed detection. The programmed flip-flop having additional current stop transistors, as described in the second embodiment, do not pass a penetrating current, thereby reducing power dissipation of the semiconductor device.

Since the above embodiments are described only for examples, the present invention is not limited to the above embodiments and various modifications or alterations can be easily made therefrom by those skilled in the art without departing from the scope of the present invention.

For example, the programmed flip-flop may be implemented by bipolar transistors, and the fuse may be implemented by a polysilicon film as well as a metallic film.

What is claimed is:

1. A programmed flip-flop comprising first and second transistors, first and second loads connected in series with said first and second transistors, respectively, between a first source line and a second source line, each of said first and second transistors having a control electrode connected to a node connecting the other of said first and second transistors and a corresponding one of said first and second loads, said first load being subjected to programming for changing resistance of said first load; and further comprising third and fourth transistors connected between said second source line and said first and second loads, respectively.

2. The programmed flip-flop as defined in claim 1, wherein said second load has a resistance between a first resistance of said first load in an original state thereof and a second resistance of said first load in a 5 cut-out state thereof.

3. The programmed flip-flop as defined in claim 2, wherein said second load includes a plurality of load elements each having said first resistance.

4. The programmed flip-flop as defined in claim 1, wherein said first load is a fuse.

5. The programmed flip-flop as defined in claim 1, wherein said second load is a resistor.

6. The programmed flip-flop as defined in claim 1, wherein said third and fourth transistors have a conductivity type opposite to a conductivity type of said first and second transistors, each of said third and fourth transistors having a control electrode connected to a node connecting the other of said third and fourth transistors and a corresponding one of said first and second loads.

7. A semiconductor memory device comprising a programmed circuit including a programmed flip-flop comprising first and second transistors, first and second loads connected in series with said first and second transistors, respectively, between a first source line and a second source line, each of said first and second transistors having a control electrode connected to a node connecting the other of said first and second transistors and a corresponding one of said first and second loads, said first load being subjected to programming for changing resistance of said first load; and further comprising third and fourth transistors connected between said second source line and said first and second loads, respectively.

8. The semiconductor memory device as defined in claim 7, further comprising a regular memory cell array including a plurality of regular memory cells, and a redundancy circuit including a plurality of redundancy memory cells, said redundancy circuit replaces one of said regular memory cells by one of said redundancy memory cells based on an output signal supplied from said programmed circuit.

9. The semiconductor memory device as defined in claim 7 comprising a mode switching circuit having said programmed circuit, said mode switching circuit switches an operational mode of said semiconductor memory device based on an output signal from said programmed circuit.

10. The semiconductor memory device as defined in claim 9, wherein said operational mode is a refreshing mode of said semiconductor memory device.

11. The semiconductor memory device as defined in claim 7, wherein said second load has a resistance between a first resistance of said first load in an original state thereof and a second resistance of said first load in a cut-out state thereof.

12. The semiconductor memory device as defined in claim 11, wherein said second load includes a plurality of load elements each having said first resistance.

13. The semiconductor memory device as defined in claim 7, wherein said first load is a fuse.

14. The semiconductor memory device as defined in claim 7, wherein said second load is a resistor.

15. The semiconductor memory device as defined in claim 7, wherein said third and fourth transistors have a conductivity type opposite to a conductivity type of said first and second transistors, each of said third and fourth transistors having a control electrode connected to a node connecting the other of said third and fourth transistors and a corresponding one of said first and second loads.

* * * * *

UNITED STATES PATENT AND TRADEMARK OFFICE
CERTIFICATE OF CORRECTION

PATENT NO. : 6,205,050 B1  
DATED : March 20, 2001  
INVENTOR(S) : Satoshi Tamaki Page 1 of 1

It is certified that error appears in the above-identified patent and that said Letters Patent is hereby corrected as shown below:

Column 7,  
Line 31, delete "to" insert -- t0 --

Column 9,  
Line 65, delete "5"

Column 10,  
Lines 2 and 58, delete "7" insert -- 8 --

Signed and Sealed this

Twenty-second Day of January, 2002

Attest:

JAMES E. ROGAN  
*Director of the United States Patent and Trademark Office*

*Attesting Officer*